United States Patent
Song

(10) Patent No.: US 7,278,044 B2
(45) Date of Patent: Oct. 2, 2007

(54) SEMICONDUCTOR MEMORY DEVICE FOR REDUCING ADDRESS ACCESS TIME

(75) Inventor: Ho-Uk Song, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 428 days.

(21) Appl. No.: 10/788,550

(22) Filed: Feb. 27, 2004

(65) Prior Publication Data
US 2005/0138456 A1   Jun. 23, 2005

(30) Foreign Application Priority Data
Dec. 17, 2003   (KR) .................. 10-2003-0092571

(51) Int. Cl.
*H04L 7/00* (2006.01)
*G06F 13/00* (2006.01)
(52) U.S. Cl. ...................... 713/400; 711/167
(58) Field of Classification Search ................. 713/400
See application file for complete search history.

(56) References Cited
U.S. PATENT DOCUMENTS
5,066,868 A * 11/1991 Doty et al. ................. 327/250

| | | | |
|---|---|---|---|
| 5,258,660 A * | 11/1993 | Nelson et al. | 327/141 |
| 6,185,664 B1 | 2/2001 | Jeddeloh | |
| 6,546,476 B1 | 4/2003 | Gillingham | |
| 2003/0090307 A1 * | 5/2003 | Shin | 327/200 |

FOREIGN PATENT DOCUMENTS
JP    06-258383    9/1994
JP    2003-051813    2/2003

* cited by examiner

*Primary Examiner*—Rehana Perveen
*Assistant Examiner*—Eric Chang
(74) *Attorney, Agent, or Firm*—Blakely Sokoloff Taylor & Zafman

(57) ABSTRACT

An apparatus for controlling operations of a synchronous semiconductor memory device, wherein each operation is achieved by a plurality of internal instructions includes a reference clock block for receiving an external clock and outputting a plurality of delayed clock signals; a control block, in response to the plurality of delayed clock signal, for outputting one of the plurality of internal instructions at a first predetermined timing which is earlier than the timing of starting the operation.

20 Claims, 14 Drawing Sheets

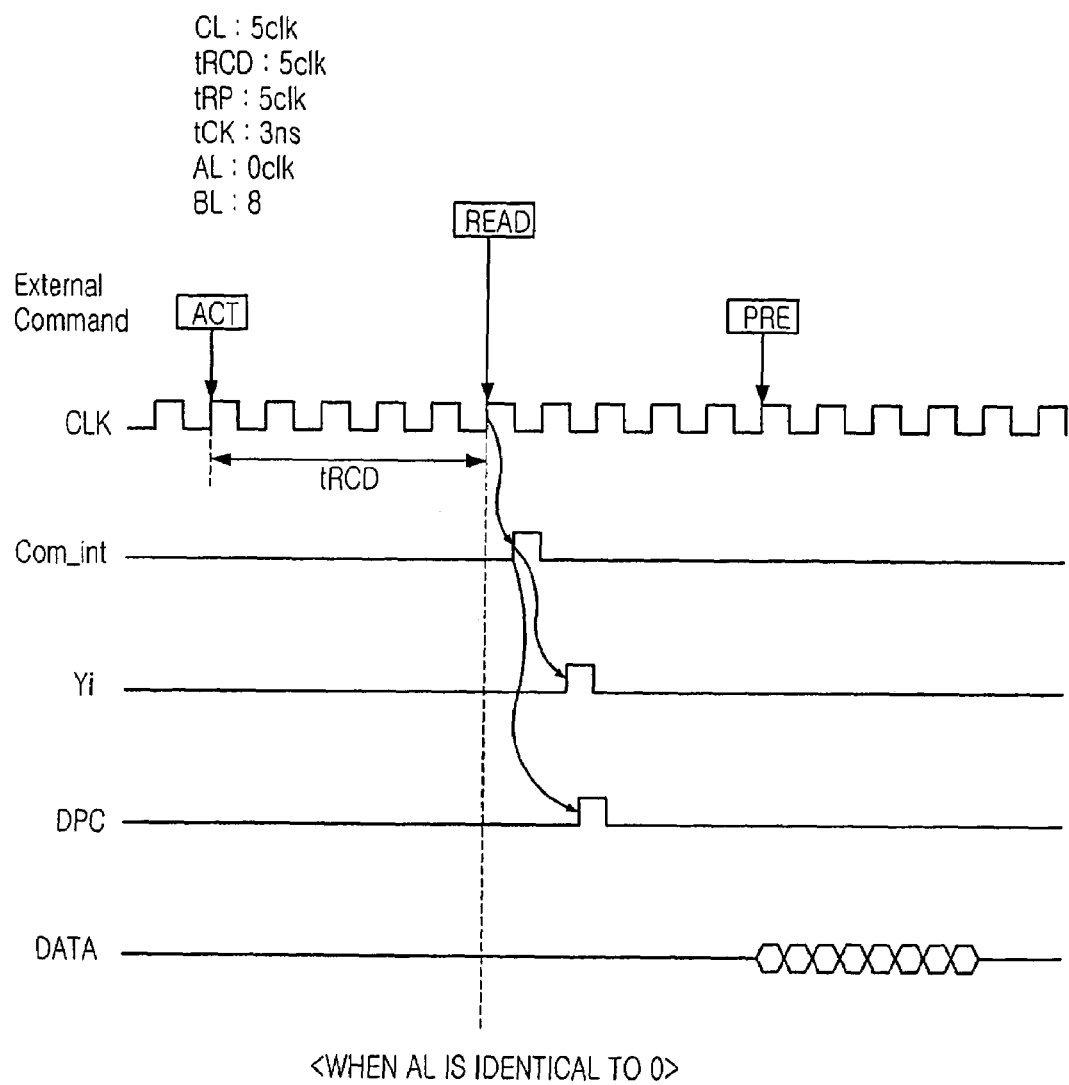

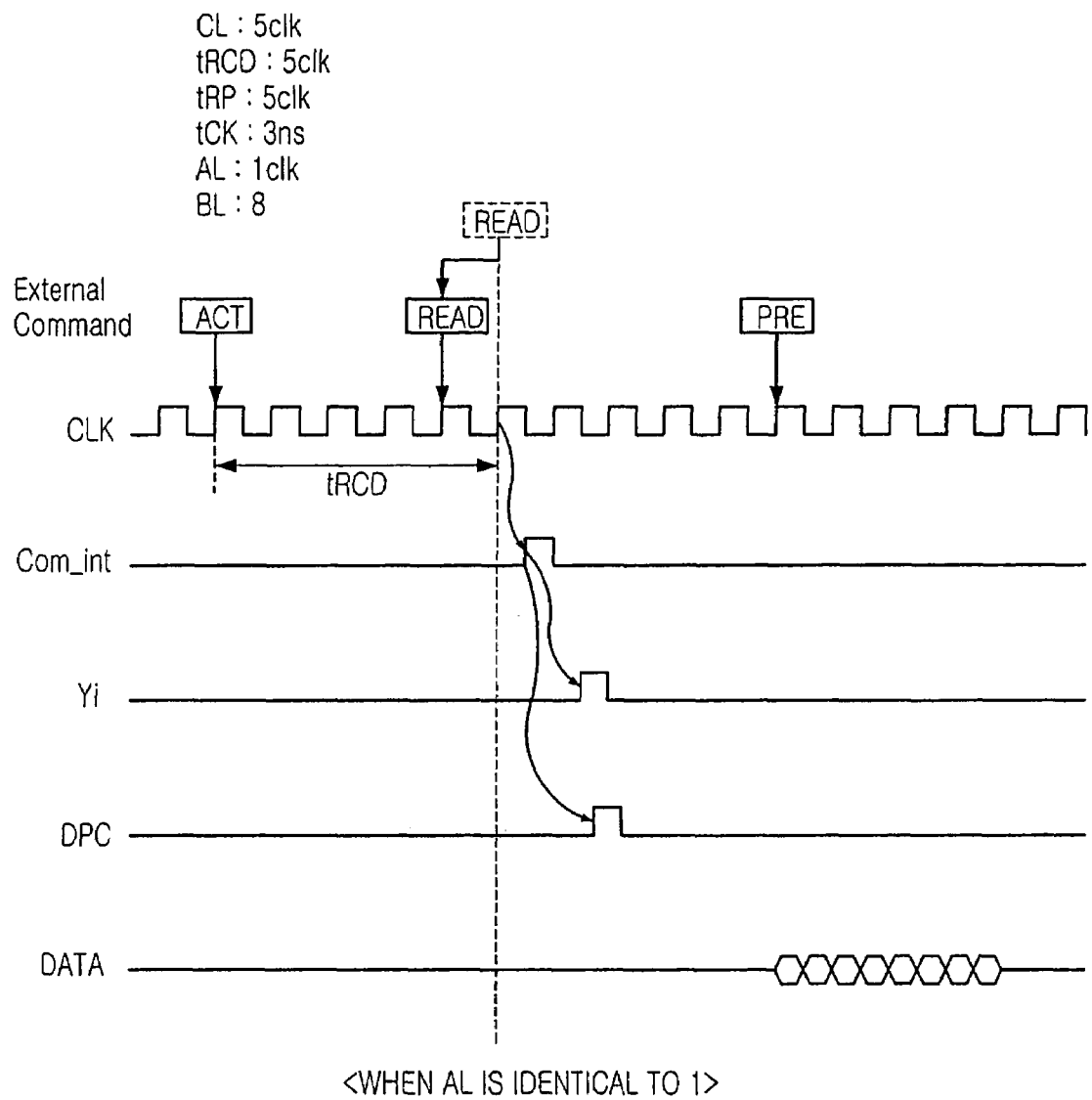

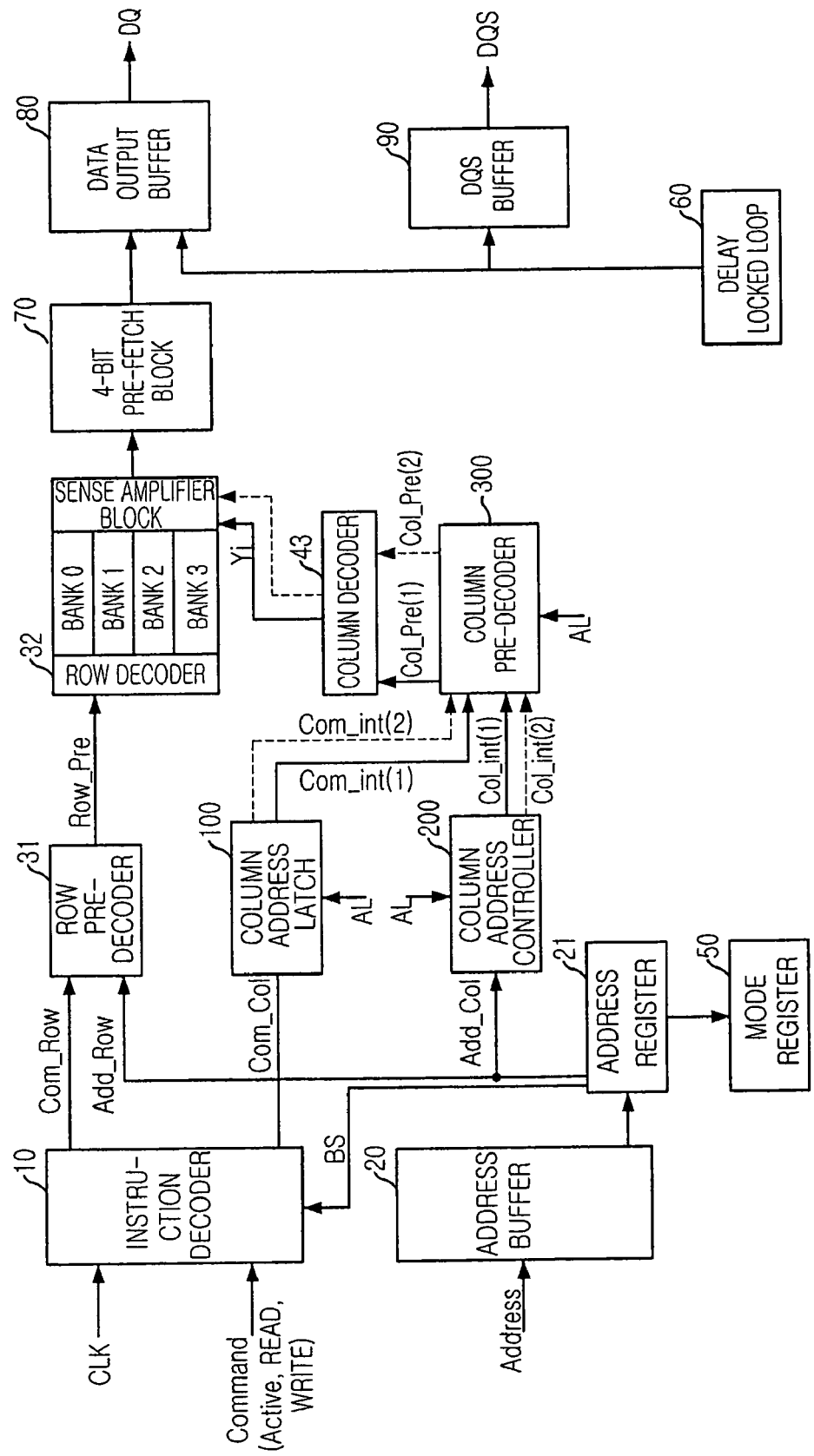

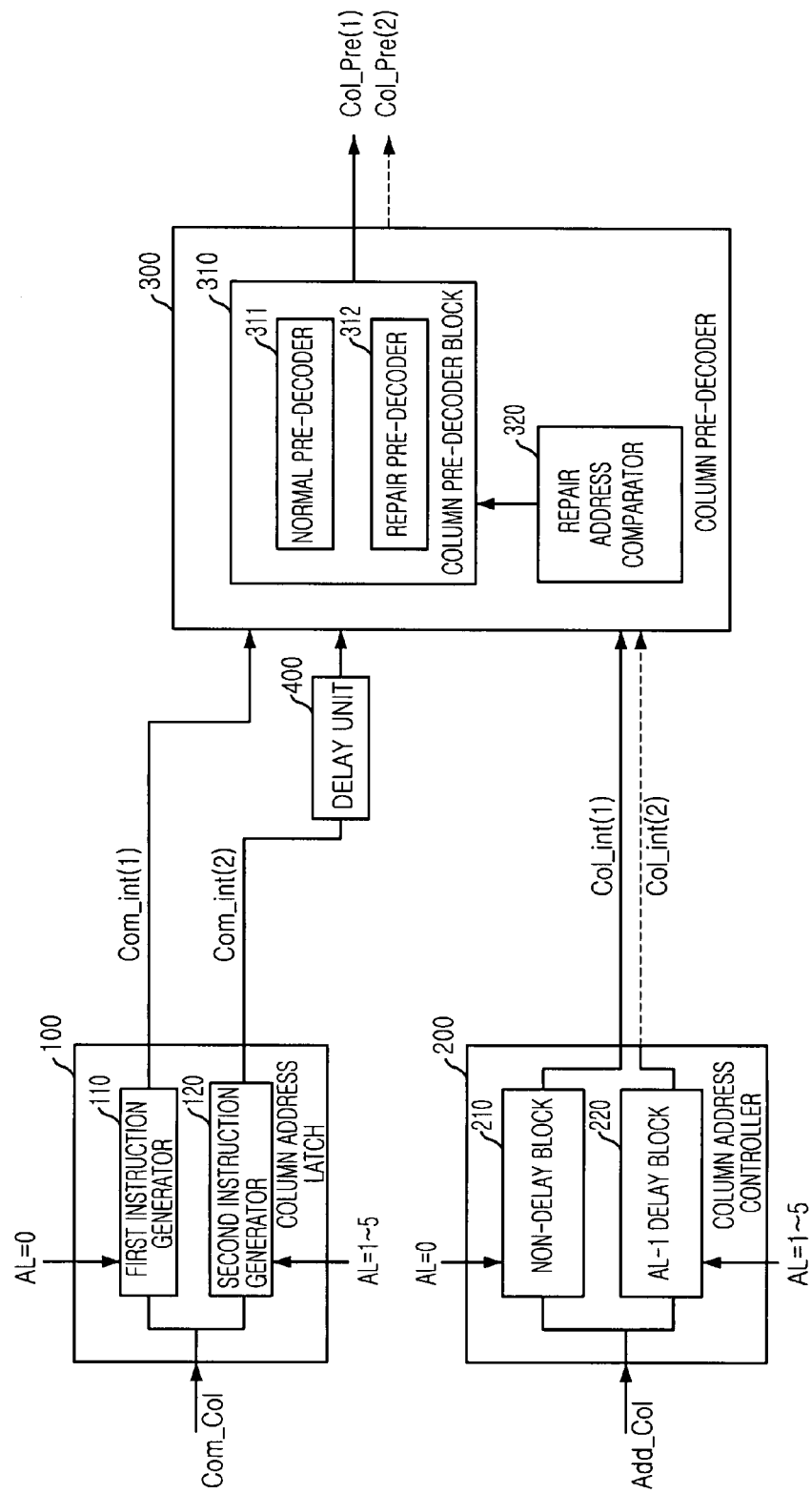

<WHEN AL IS IDENTICAL TO 1>

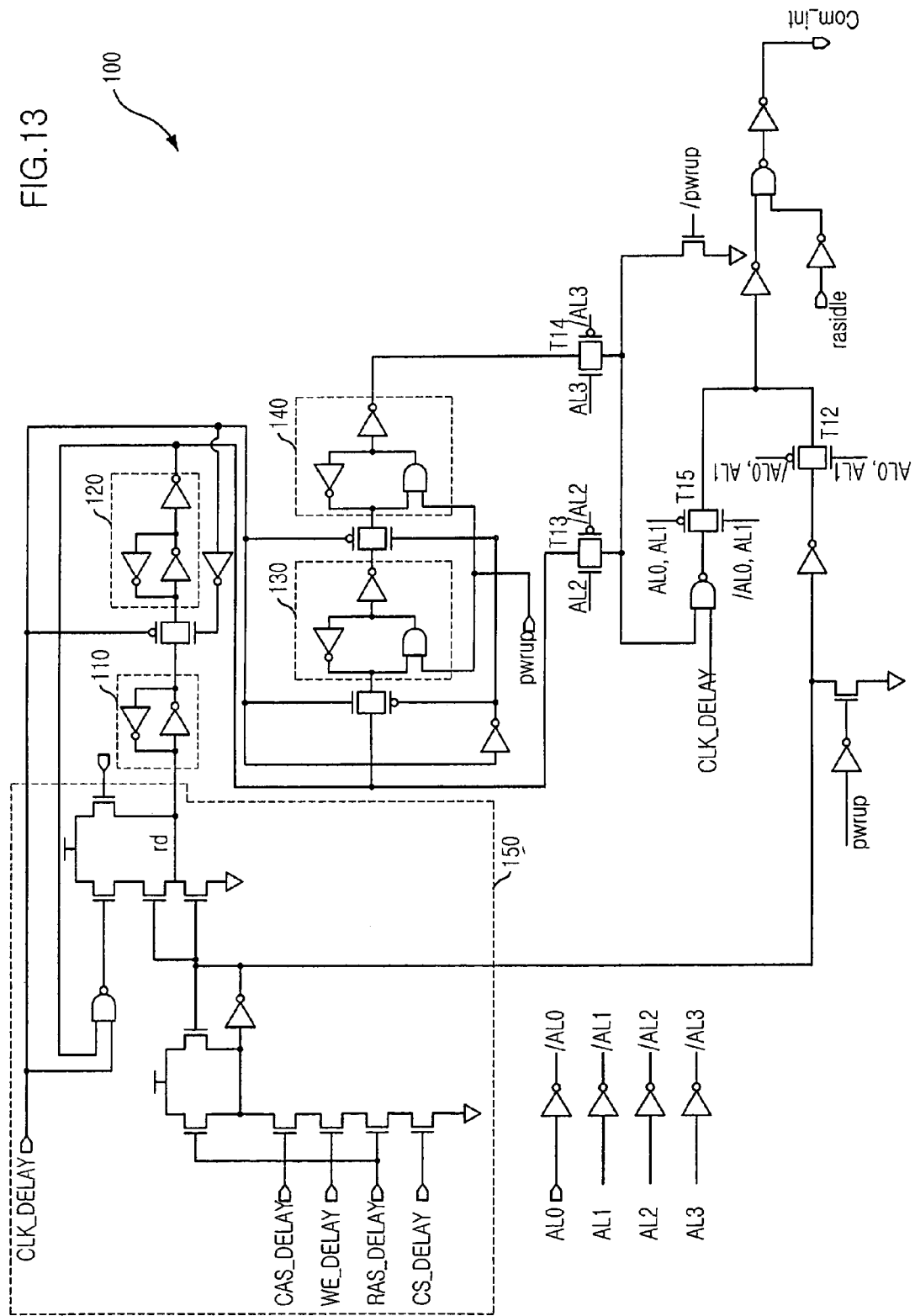

SEMICONDUCTOR MEMORY DEVICE FOR REDUCING ADDRESS ACCESS TIME

FIELD OF INVENTION

The present invention relates to a semiconductor memory device; and, more particularly, to an apparatus for reducing an address access time tAA of the semiconductor memory device.

DESCRIPTION OF PRIOR ART

A semiconductor memory device has been evolved for improving an operation speed and increasing a degree of integration. Especially, for improving the operation speed, a synchronous semiconductor memory device (hereinafter, referred as a SYNCHMOMORY), which can be operated by synchronizing with an external clock signal, is appeared as a kind of the semiconductor memory device.

First, a single data rate SYNCHMOMORY (hereinafter, a single data rate is referred as a SDR), which inputs or outputs a data through a data pin during one period of the external clock signal, especially a rising edge of the external clock signal, is developed.

However, the SDR SYNCHMOMORY is not enough to satisfy an operation speed of a system which should be operated in high speed. Thus, for handling two data during one period of the external clock signal, i.e. inputting or outputting each data at each of rising and falling edges of the external clock signal, a double data rate SYNCHMOMORY is suggested (hereinafter, a double data rate is referred as a DDR).

Namely, at each data pin of the DDR SYNCHMOMORY, each of two continuous data is inputted or outputted at each of the rising and falling edges of the external clock signal. As a result, though a frequency of the external clock signal, i.e. generally an operating clock signal, does not increase, the DDR SYNCHMOMORY can have at least twice the bandwidth as the SDR SYNCHMOMORY and operate in high speed.

On the other hand, for stabling an operation of the DDR SYNCHMOMORY, new configurations which do not exist in the conventional semiconductor memory device are necessary. For example, these are a column address strobe (CAS) latency, a burst length, an additive latency, and the like.

The CAS latency is what the number of the operating clock signal periods is required after an instruction such as a read command or a write command is inputted to the semiconductor memory device until a data in response to the instruction is outputted to an external circuit. In addition, the burst length is the number of data continuously outputted by one time data access operation.

Especially, as one of configurations related to only DDR SYNCHMOMORY, the additive latency is what the number of the operating clock signal periods is required to a tRCD timing from the timing, which the instruction such as the read command or the write command is inputted to the semiconductor memory device after the semiconductor memory device is activated. Herein, the tRCD timing means a RAS to CAS delay, i.e. a period from the timing when a row address strobe (RAS) is generated to the timing when a column address strobe (CAS) is generated. Namely, as the synchronous memory device generally receives an active command, a read/write command and a precharge command, the additive latency is related to when the read/write command is received at faster timing than a predetermined timing.

For example, if the additive latency is 2, an operation, such as a data access operation, in response to a read/write command is executed after two operating clocks since when the read/write command is inputted to the semiconductor memory device. In the contrast, in the semiconductor memory device without the additive latency, the operation in response to the read/write command is executed after the tRCD timing since when the read/write command is inputted to the semiconductor memory device.

Namely, in the semiconductor memory device with the additive latency, the operation in response to the read/write command can be executed before the tRCD timing, after the read/write command is inputted to the semiconductor memory device.

FIG. 1 is a block diagram showing a conventional semiconductor memory device.

As shown, the conventional semiconductor memory device includes an instruction decoder 10, an address buffer block 20, an address register 21, a row pre-decoder 31, a row decoder 32, a column active latch 11, a column address controller 41, a column pre-decoder 42, a column decoder 43, a plurality of banks bank0 to bank3, a prefetch block 70 and a data output buffer 80.

The instruction decoder 10 receives instructions such as an active, a read or a write command and outputs a row command signal Com_Row related to a row address and a column command signal Com_Col related to a column address. In the other hand, the address buffer block 20 receives an address inputted from an external part and buffers the address to output to the address register 21. Then, the address register 21 is for dividing the address into the row address Add_Row and the column address Add_Col and outputting a BS signal, i.e. a bank selection signal in response to the address.

Next, the row pre-decoder 31 predecodes the row address Add_Row in response to the row command signal com_Row and outputs the predecoded row address as a row pre-decoding signal Row_Pre. After that, the row decoder 32 decodes the row pre-decoding signal Row_Pre.

In the other hand, the column active latch 11 outputs an internal command signal Com_int, which is related to a read or write operation, in response to the column command signal Com_Col and the additive latency AL. Then, the column address controller 41 latches the column address Add_Col and counts the latched column address to output an internal column address Col_int to the column pre-decoder 41. Next, the column pre-decoder 42 predecodes the internal column address Col_int to output as a column pre-decoding signal Col_Pre. After that, the column decoder 43 decodes the column pre-decoding signal Col_Pre and outputs a YI signal.

Each of the plurality of banks bank0 to bank3 includes a plurality of unit cells and the sense amplifier block for sensing and amplifying a data stored in a unit cell of each bank. The prefetch block 70 is for prefetching the amplified data by the sense amplifier block and the data output buffer 80 is for outputting the data prefetched by the prefetch block 70.

Furthermore, the semiconductor memory device includes a DQS buffer 90 for outputting a data strobe signal DQS, a delay locked loop 60 for outputting a delay locked clock and a mode register 50 for storing setting signals related to operations of the semiconductor memory device.

Herein, the data strobe signal DQS, which is used only in the DDR SYNCHMOMORY, determines a timing that the data buffered by the data output buffer 80 is outputted to an external part. In addition, for synchronizing the outputted data with an external clock signal inputted to the DDR SYNCHMOMORY, the delayed locked loop 50 outputs a delay locked internal operation clock. Lastly, the mode register 50 stores conditions such as the burst length, the additive latency and the like.

Moreover, because each bank in the SYNCHMOMORY includes the row decoder and the column decoder though FIG. 1 shows just one decoder, the row decoder and the column decoder in response to the selected bank according to the inputted address should be selected. Thus, the address register 21 outputs the BS signal to the instruction decoder 10.

In addition, the column address controller 41 receives a column address and outputs the internal column address Col_int in response to the burst length and a data output mode (×4, ×8, ×16), e.g. even outputted data and odd outputted data if the semiconductor memory device is the DDR SYNCHMOMORY.

FIG. 2 is a block diagram describing some blocks, which are related to the column address, in the conventional semiconductor memory device shown in FIG. 1.

As shown, the column pre-decoder 42 includes a column pre-decoder block 42-1 for predecoding the internal column address Col_int in response to the internal command signal Com_int and a repair address comparator 42-2 for comparing the internal column address Col_int with a repaired address to find out whether the internal column address Col_int is the repaired address or not.

In detail, the column pre-decoder block 42-1, which outputs the column pre-decoding signal Col_Pre to the column decoder 43, includes a normal pre-decoder for predecoding the internal column address Col_int if the internal column address Col_int is not the repaired address and a repair pre-decoder for predecoding the internal column address Col_int if the internal column address Col_int is the repaired address.

Generally, the semiconductor memory device includes a plurality of spare unit cells for providing against errors of a manufacturing process. Then, during a repair process, the error unit cells are interchanged into the spare unit cells. Thus, for these repaired unit cells, the repair pre-decoder is needed.

FIG. 3 is a schematic circuit diagram depicting a partial circuit of the column address controller 41 shown in FIG. 1.

As shown, the column address controller 41 includes a plurality of serially connected first latches 41_1 to 41_6. A column address signal pair Add_Col and /Add_Col synchronized with a clock signal CLK_DELAY is sequentially inputted to each of the first latches 41_1 to 41_6. The column address Add_Col is outputted through four transmission gates T1 to T4 in response to the additive latency, e.g. AL0 to AL3. Herein, each transmission gate T2 to T4 except a first transmission gate T1 not connected to the plurality of first latches 41_1 to 41_6 is coupled at every two latches. As a result, by selectively turning on each transmission T1 to T4 based on each of the additive latencies AL0 to AL3, the timing when the column address controller 41 outputs the internal column address Col_int can be determined.

For example, if the additive latency is 2, a third transmission gate T3 is turned on. At this time, the column address signal pair Add_Col and /Add_Col is delayed by the four serially connected first latches 41_1 to 41_4. Namely, because a delay value of the four serially connected first latches 41_1 to 41_4 is equal to two periods of clock signal CLK_DELAY, the column address controller 41 can outputs the internal column address Col_int to the column pre-decoder 42 after two periods of the operation clock. In the contrast, if the additive latency is 0, the first transmission gate T1 is turned on. As a result, the internal column address Col_int can be outputted without any delay due to the clock signal CLK_DELAY.

FIG. 4 is a schematic circuit diagram depicting a partial circuit of the column active latch 11 shown in FIG. 1. Herein, the column active latch 11 is for outputting the internal command signal Com_int in response to the instruction such as a read command or a write command.

As shown, the column active latch 11 includes a plurality of serially connected second latches 11_1 to 11_6. A first control signal rd in response to commands such as a read command or a write command, e.g. CAS_DELAY, WE_DELAY, RAS_DELAY and CS_DELAY, synchronized with the clock signal CLK_DELAY is sequentially inputted to each of the second latches 11_1 to 11_6. The internal command signal Com_int is outputted through three transmission gates T6 to T8 in response to the additive latency, e.g. AL1 to AL3. Herein, each transmission gate T6 to T8 is coupled at every two latches. As a result, by selectively turning on each transmission T6 to T8 based on each of the additive latencies AL1 to AL3, the timing that the column active latch 11 outputs the internal command signal Com_int can be determined. Moreover, if the additive latency is 0, a fifth transmission gate T5 is turned on. As a result, the internal command signal Com_int can be outputted without any delay due to the clock signal CLK_DELAY.

As mentioned above, the first control signal rd is generated by combining a read command or a write command, e.g. CAS_DELAY, WE_DELAY, RAS_DELAY and CS_DELAY in response to the instruction which is inputted to the semiconductor memory device.

FIG. 5 is a waveform demonstrating a read operation of the conventional semiconductor memory device shown in FIG. 1 when the additive latency is 0.

As shown, it is assumed that the CAS latency is 5 tCLK, the tRCD timing is 5 tCLK, the burst length is 8 and a period of operation clock, i.e. 1 tCLK, is 3 nsec. In addition, a precharge command is generated past 5 tCLK after the tRCD timing; and the additive latency is 0.

For achieving the read operation in the semiconductor memory device, an active command ACT, a read command READ and a precharge command PRE is sequentially inputted. Herein, by the active command ACT, the semiconductor memory device receives a row address to activate a word line. Then, the semiconductor memory device senses and amplifies a plurality of data stored in a plurality of unit cells corresponding to the activated word line.

Next, by the read command READ, the semiconductor memory device receives a column address to perform predecoding and decoding processes. Throughout the pre-decoding and decoding processes, a requested data is selected among the plurality of amplified data and outputted to an external part. Then, the precharge command PR removes the plurality of amplified data on a plurality of bit lines.

During the read operation, an operation of the read command READ is carried out past the tRCD timing after the active command ACT is activated. At this time, the column active latch 11 generates the internal command signal Com_int for controlling the operation of the read command READ. Then, throughout the column address controller 41 and the column pre-decoder 42, the predecoding signal Col_Pre is outputted. Next, the column decoder 43 decodes the pre-decoding signal Col_Pre to output as the YI signal. As a result, the sense amplifier block in the bank outputs the requested data among the plurality of amplified data by the YI signal.

Referring to FIG. 5, after the active command ACT is inputted, the internal command signal Com_int is generated past 5 tCLK in response to the tRCD timing. The YI signal is generated in response to the internal command signal Com_int. The requested data DATA is outputted in response to the YI signal and a data path control signal DPC. Herein, the data path control signal DPC means a plurality of control signals for controlling the prefetch block 70 and the data output buffer 80 in order to output the requested data DATA, in response to the internal command signal Com_int, at a predetermined timing, i.e. after 5 tCLK because the CAS latency is 5.

As described in FIG. 5, in the case that the additive latency is 0, like a synchronous semiconductor memory device without the additive latency, operations in response to the read command READ are performed past the tRCD timing after the active command ACT is inputted.

FIG. 6 is a waveform demonstrating a read operation of the conventional semiconductor memory device shown in FIG. 1 when the additive latency is 1.

As shown, if the additive latency is 1, the read command READ is inputted at the timing being earlier the additive latency than the timing past the tRCD timing after the active command ACT is inputted. Namely, because the additive latency is 1, the read command READ is inputted at one clock earlier than the timing past the tRCD timing, i.e. 5 tCLK.

A chip set included in the semiconductor memory device outputs the read command READ at the timing being earlier than at a predetermined timing based on the additive latency. As a result, the chip set has a time margin for performing operations in response to the instruction. However, in a viewpoint of an operation in response to an inputted instruction, an operation speed of the DDR synchronous semiconductor memory device is not faster than that of the convention synchronous semiconductor memory device.

As a high technology is rapidly developed, it is needed the semiconductor memory device which can operates in higher speed. For increasing an operation speed of the semiconductor memory device, it is so easy to increase a frequency of the operation clock.

Basically, the semiconductor memory device should spend an operation time for receiving and decoding an inputted address and outputting data stored in the unit cell to an external circuit. Furthermore, it is hardly to reduce the operation time. As a result, even though the frequency of the operation clock is increased, it is impossible to perform an operation in response to an inputted instruction every period of the operation clock. Namely, each operation can be carried out during at least two periods of the operation clock.

In the semiconductor memory device, the timing for handling an inputted address in order to perform a stable operation corresponding to an inputted instruction is called an address access timing tAA. Today, the address access timing tAA is generally about 15 nsec. For example, if the frequency of the operation clock is 200 MHz, the period of the operation clock is 5 nsec. In this case, for the address access timing tAA, the semiconductor memory device spends 3 periods of the operation clock. Namely, the address access timing tAA means a time period until a corresponding unit cell is selected among a plurality of unit cells included in a bank after an address is inputted.

Eventually, for reducing the address access timing tAA, there can be two methods: one is to increasing a supply voltage of the semiconductor memory device; and the other is to improving a characteristic or a property of a MOS transistor included in the semiconductor memory device.

If the supply voltage is increased, the address access timing tAA can be decreased. However, a semiconductor memory device supplied with a higher supply voltage cannot be used as a low power memory device because a power consumption of the semiconductor memory device is increased. Also, for improving the characteristic or the property of the MOS transistor, a lot of cost and time is needed.

SUMMARY OF INVENTION

It is, therefore, an object of the present invention to provide a semiconductor memory device for reducing an address access time tAA.

In accordance with an aspect of the present invention, there is provided an apparatus for controlling operations of a synchronous semiconductor memory device, wherein each operation is achieved by a plurality of internal instructions including a reference clock block for receiving an external clock and outputting a plurality of delayed clock signals; a control block, in response to the plurality of delayed clock signal, for outputting one of the plurality of internal instructions at a first predetermined timing which is earlier than the timing of starting the operation.

In accordance with an aspect of the present invention, there is provided a synchronous semiconductor memory device including an instruction and address receiving block for receiving an external clock, an external instruction, a row address and a column address and outputting a plurality of internal instructions after decoding the external instruction; a row address control block, controlled by at least one of the plurality of internal instructions, for decoding the row address; a column address control block, controlled by at least one of the plurality of internal instructions, for decoding the column address; a bank for inputting or outputting a data in response to the decoded row and column addresses; and an I/O block for delivering the data between the bank and an external circuit, wherein the column address control block includes a reference clock block for receiving an external clock and outputting a plurality of delayed clock signals; and a control block, in response to the plurality of delayed clock signal, for performing one among the plurality of internal instructions at a first predetermined timing which is earlier than the timing of starting the operation.

In accordance with an aspect of the present invention, there is provided a method for controlling operations of a synchronous semiconductor memory device, wherein each operation is achieved by a plurality of internal instructions performing an instruction in response to an additive latency, including the step of A) receiving an external clock and outputting a plurality of delayed clock signals; and B) outputting one of the plurality of internal instructions at a first predetermined timing which is earlier than the timing of starting the operation, in response to the plurality of delayed clock signal.

BRIEF DESCRIPTION OF DRAWINGS

The above and other objects and features of the present invention will become apparent from the following description of preferred embodiments taken in conjunction with the accompanying drawings, in which:

FIG. 5 is a waveform demonstrating a read operation of the conventional semiconductor memory device shown in FIG. 1 when an additive latency is 0;

FIG. 6 is a waveform demonstrating a read operation of the conventional semiconductor memory device shown in FIG. 1 when an additive latency is 1;

FIG. 7 is a block diagram showing a semiconductor memory device in accordance with the present invention;

FIGS. 8A and 8B are block diagrams describing some blocks, which are related to a column address, in the semiconductor memory device shown in FIG. 7;

FIG. 13 is a schematic circuit diagram depicting a column active latch shown in FIG. 7.

DETAILED DESCRIPTION OF THE INVENTION

Figure 1:
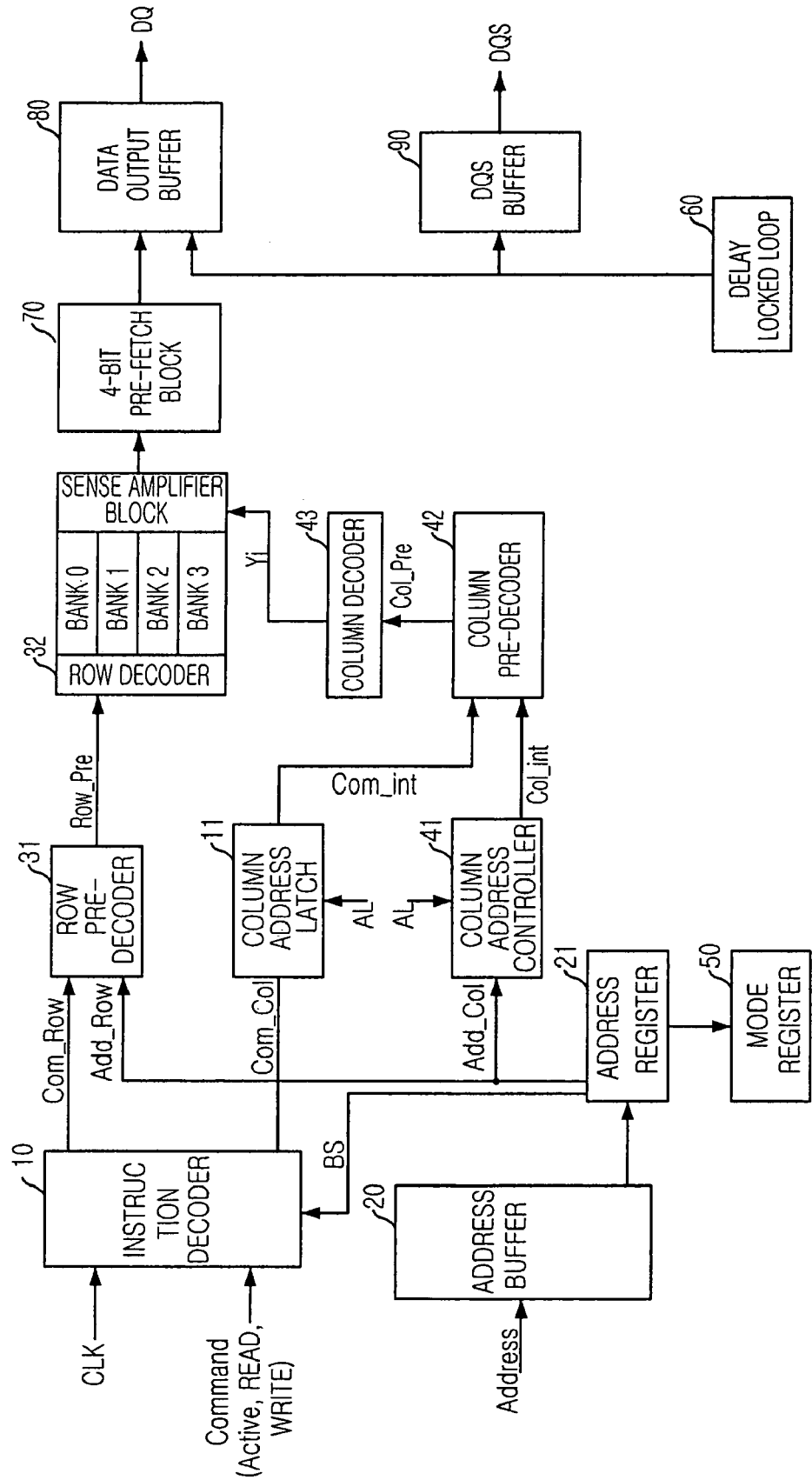
FIG. 1 is a block diagram showing a conventional semiconductor memory device.
Figure 2:
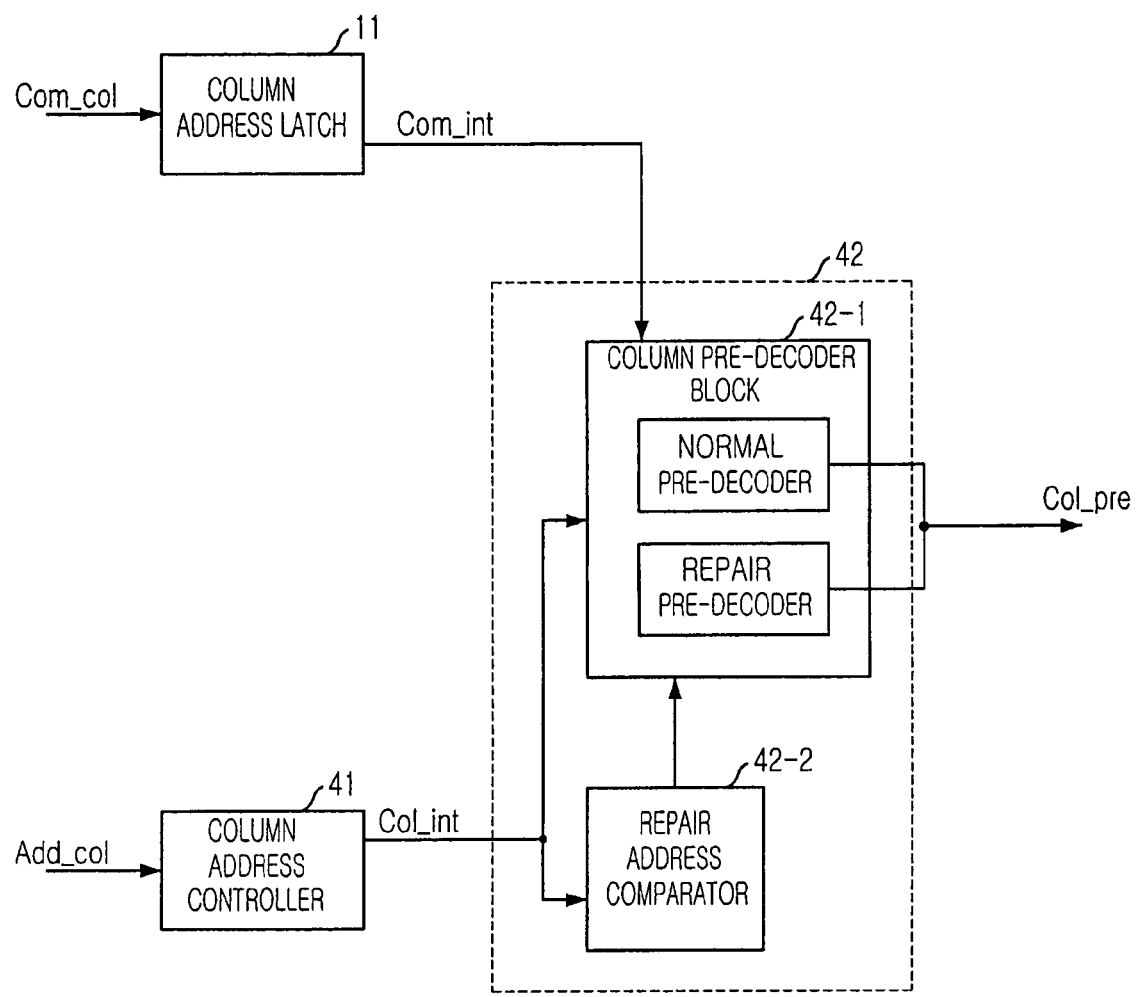
FIG. 2 is a block diagram describing some blocks, which are related to a column address, in the conventional semiconductor memory device shown in FIG. 1.
Figure 3:
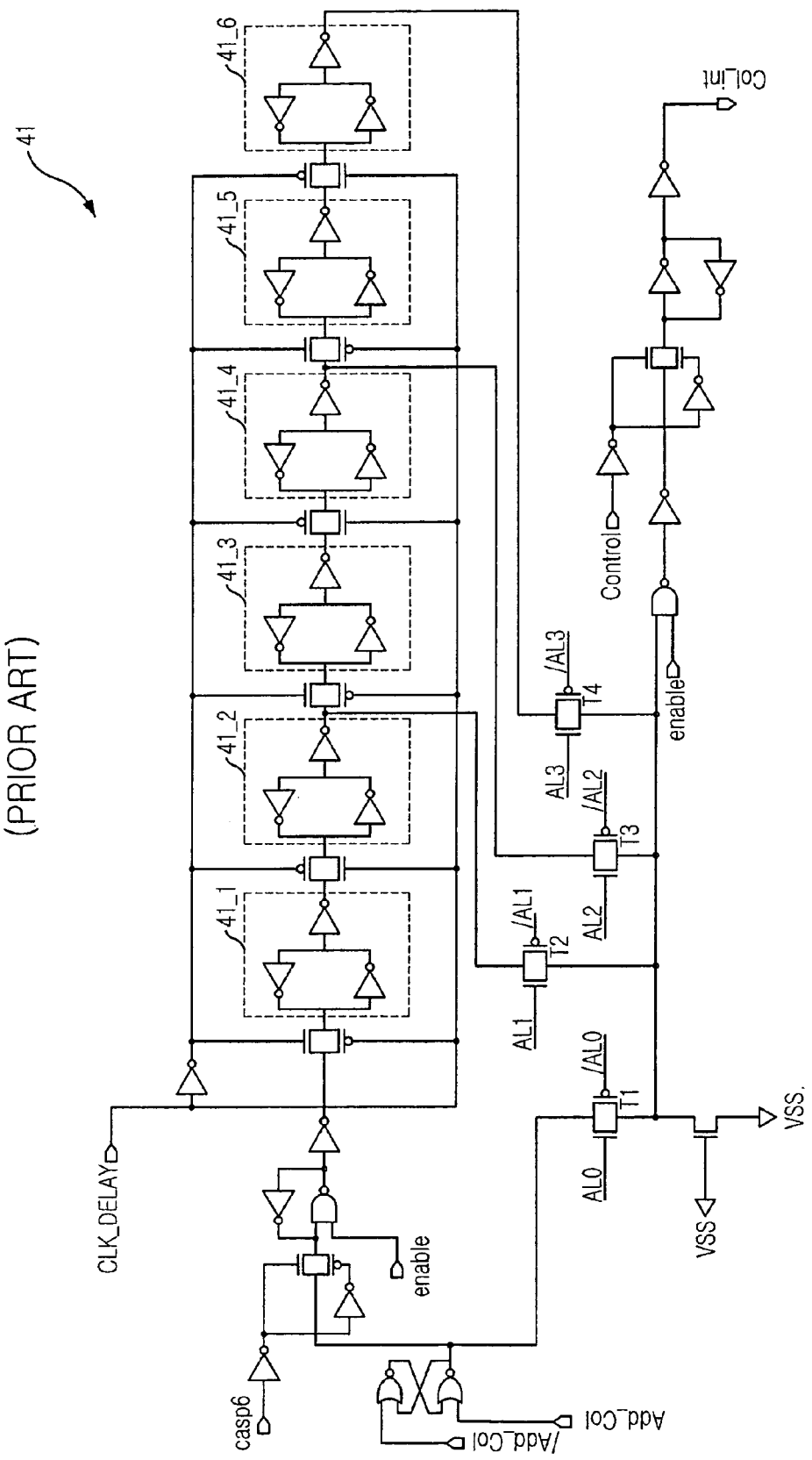
FIG. 3 is a schematic circuit diagram depicting a partial circuit of a column address controller shown in FIG. 1.
Figure 4:
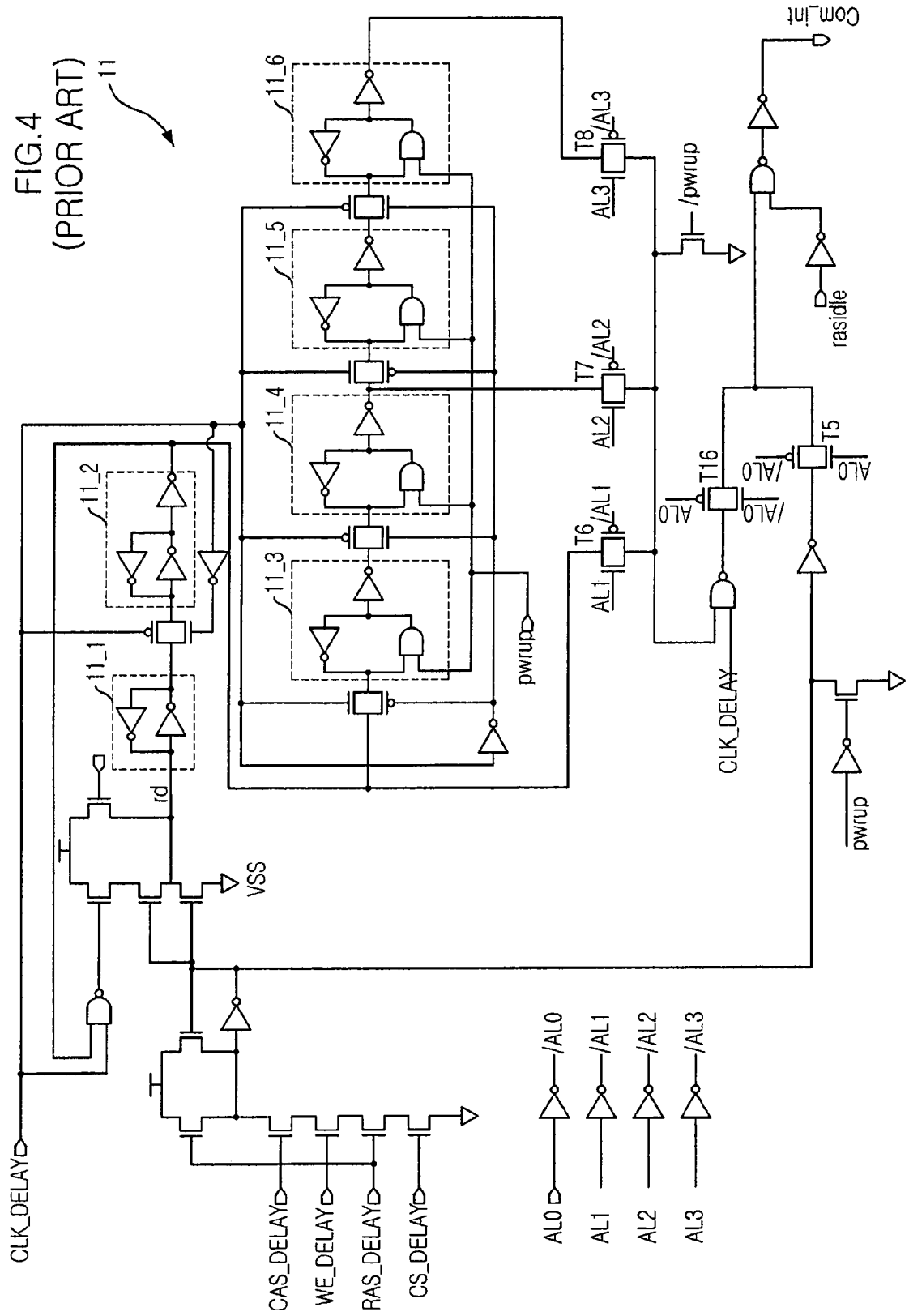
FIG. 4 is a schematic circuit diagram depicting a partial circuit of a column active latch shown in FIG. 1.

Hereinafter, an apparatus for reducing an address access time tAA of the semiconductor memory device according to the present invention will be described in detail referring to the accompanying drawings.

FIG. 7 is a block diagram showing a semiconductor memory device in accordance with the present invention.

As shown, the conventional semiconductor memory device includes an instruction decoder 10, an address buffer block 20, an address register 21, a row pre-decoder 31, a row decoder 32, a column active latch 100, a column address controller 200, a column pre-decoder 300, a column decoder 43, a plurality of banks bank0 to bank3, a prefetch block 70 and a data output buffer 80.

The semiconductor memory device further includes a DQS buffer 90, a delay locked loop 60 and a mode register 50. Herein, because all function blocks except for the column active latch 100, the column address controller 200 and the column pre-decoder 300 are equal to those shown in FIG. 1, the detailed description is omitted.

In brief, the synchronous semiconductor memory device includes an instruction and address receiving block having the instruction decoder 10, the address buffer block 20, the address register 21 and the mode register 50; a row address control block having the row pre-decoder 31 and the row decoder 32; a column address control block having the column active latch 100, the column address controller 200, the column pre-decoder 300 and the column decoder 43; a bank; and an I/O block having a DQS buffer 90, a delay locked loop 60, a prefetch block 70 and a data output buffer 80.

The instruction and address receiving block is for receiving an external clock, an external instruction, a row address and a column address and outputting a plurality of internal instructions after decoding the external instruction. The row address control block controlled by at least one of the plurality of internal instructions is for decoding the row address. The column address control block controlled by at least one of the plurality of internal instructions is for decoding the column address. The bank inputs or outputs a data in response to the decoded row and column addresses. The I/O block is for delivering the data between the bank and an external circuit.

Moreover, the column address control block includes a reference clock block for receiving an external clock and outputting a plurality of delayed clock signals; and a control block, in response to the plurality of delayed clock signal, for performing one among the plurality of internal instructions at a first predetermined timing which is earlier than the timing for starting the operation.

Herein, the first predetermined timing is earlier one external clock period than the tRCD timing. The tRCD timing means a RAS to CAS delay, i.e. a period from the timing that a row address strobe (RAS) is generated to the timing that a column address strobe (CAS) is generated.

If an additive latency AL is 0, each of the column active latch 100, the column address controller 200 and the column pre-decoder 300 outputs each of a first internal command signal Com_int(1), a first internal column address Col_int(1) and a first pre-decoding signal Col_Pre(1). Otherwise, if the additive latency AL is not 0, i.e. the additive latency is 1, 2, 3 or etc, each of the column active latch 100, the column address controller 200 and the column pre-decoder 300 outputs each of a second internal command signal Com_int (2), a second internal column address Col_int(2) and a second pre-decoding signal Col_Pre(2). Herein, the second internal command signal Com_int(2) outputted from the column active latch 100 is outputted at the timing being earlier one external clock period than the tRCD timing.

Furthermore, in the present invention, each of the column active latch 100, the column address controller 200 and the column pre-decoder 300 can has one output line for outputting each of first and second signals, e.g. Com_int(1) and Com_int(2), at each different timing or two output lines, each for outputting each of first and second signals, e.g. Com_int(1) and Com_int(2), based on the additive latency AL.

Figure 8B:
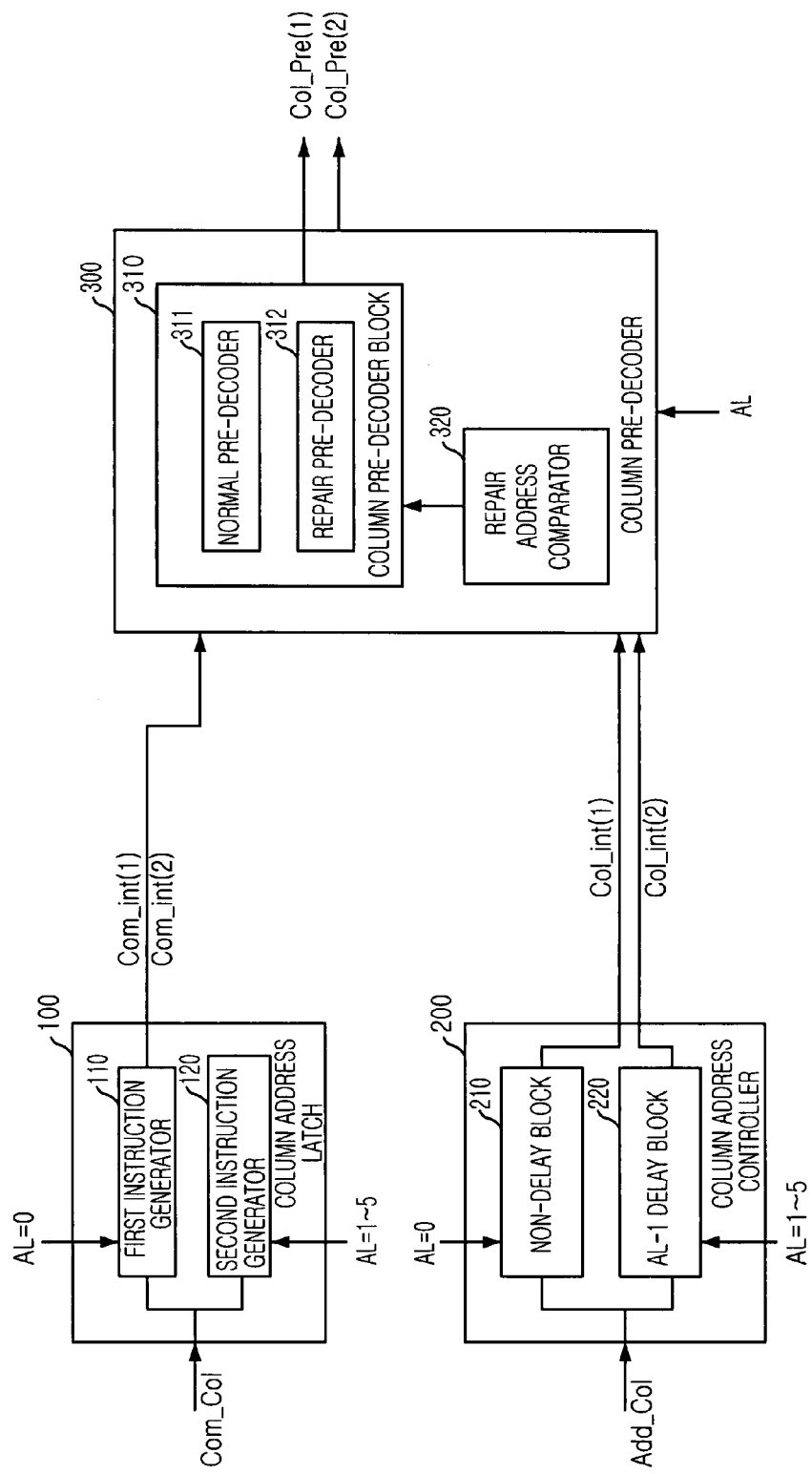

FIGS. 8A and 8B are block diagrams describing some blocks, which are related to a column address, in the semiconductor memory device shown in FIG. 7.

As shown in FIG. 8A, the column active latch 100 has two output lines, each for outputting each of first and second internal command signals, e.g. Com_int(1) and Com_int(2). The second internal command signals Com_int(2) passes throughout a delay unit 400. Herein, delay value of the delay unit 400 is shorter than one external clock period. For example, if a period of the external clock is 3 nsec, the delay value can be about 1 nsec, i.e. under 3 nsec.

In detail, the column active latch 100 includes a first command generator 110 for outputting the first internal command signals Com_int(1) past the tRCD timing in the case when the additive latency AL is 0; and a second command generator 120 for outputting the second internal command signals Com_int(2) at the timing being earlier one external clock period than the tRCD timing in the case when the additive latency AL is not 0.

In this case, the second internal command signals Com_int(2) is outputted at the timing being earlier one external clock period than the tRCD timing. Namely, the semiconductor memory device has 3 nsec timing margin. As shown in FIG. 8A, if the second internal command signals Com_int(2) is delayed by the delay unit 400, a timing error generated in the column pre-decoder 300 can be decreased. Furthermore, if 3 nsec timing margin is used for preventing a timing error and improving an address access timing tAA, the semiconductor memory device can be operated more stably. As a result, a fractional yield of the semiconductor memory device is increased.

Recently, for increasing the operation speed of the semiconductor memory device, every block included in the semiconductor memory device is operated without any timing margin. However, like the present invention, if 3 nsec timing margin obtained from the column active latch 100 would be used for improving the address access timing tAA, the semiconductor memory device can be operated more stably.

Similar to the column active latch 100, the column address controller 200 includes a non-delay block 210 for outputting the first internal column address Col_int(1) without any delay in the case when the additive latency AL is 0; and an AL-1 delay block 220 for outputting the second internal column address Col_int(2) at a predetermined timing being earlier than the tRCD timing in the case when the additive latency AL is not 0.

Referring to FIG. 8A, the column pre-decoder 300 includes a column pre-decoder block 310 for predecoding the first or second internal column address Col_int(1) or Col_int(2), which is outputted from the non-delay block 210 or the AL-1 delay block 220, in response to the first or second internal command signal Com_int(1) or Com_int(2), which is outputted from the first command generator 110 or the second command generator 120, and a repair address comparator 320 for comparing the first or second internal column address Col_int(1) or Col_int(2) with a repaired address in order to find out whether the first or second internal column address Col_int(1) or Col_int(2) is the repaired address or not.

In detail, the column pre-decoder block 310, which outputs the first or second column pre-decoding signal Col_Pre (1) or Col_Pre(2) to the column decoder 43, includes a normal pre-decoder 311 for predecoding the first or second internal column address Col_int(1) or Col_int(2) if the first or second internal column address Col_int(1) or Col_int(2) is not the repaired address and a repair pre-decoder 312 for predecoding the internal column address Col_int if the internal column address Col_int is the repaired address.

Referring to FIG. 8B, the column active latch 100 has one output lines for outputting the first or second internal command signal, i.e. Com_int(1) or Com_int(2), whether the additive latency is 0 or not. In this case, the column pre-decoder 300 should receive the additive latency AL in order to output the first or second pre-decoding signal Col_Pre(1) or Col_Pre(2).

Figure 9:
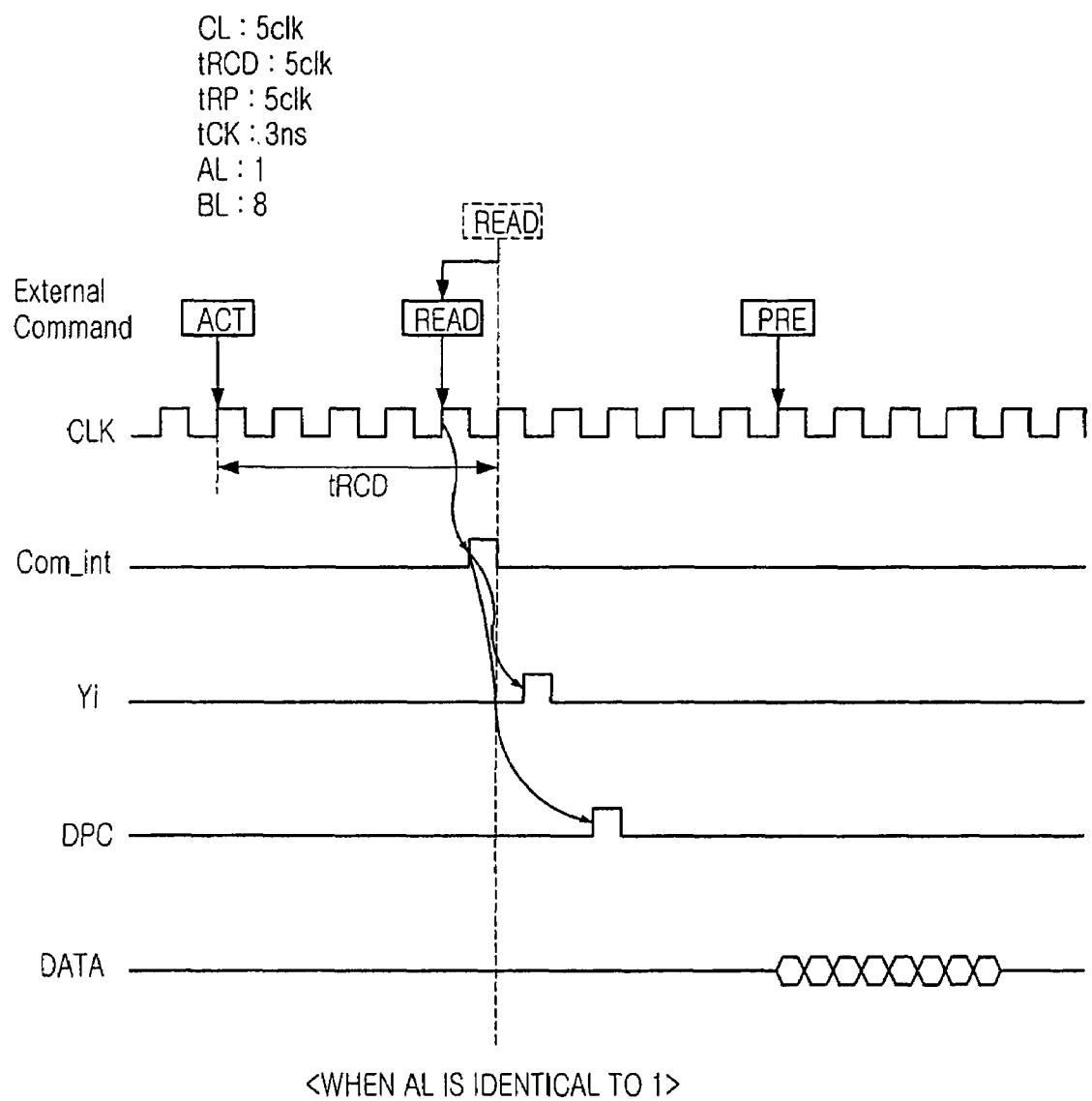
FIG. 9 is a waveform demonstrating a read operation of the semiconductor memory device shown in FIG. 7 when an additive latency is 1.
Figure 10:
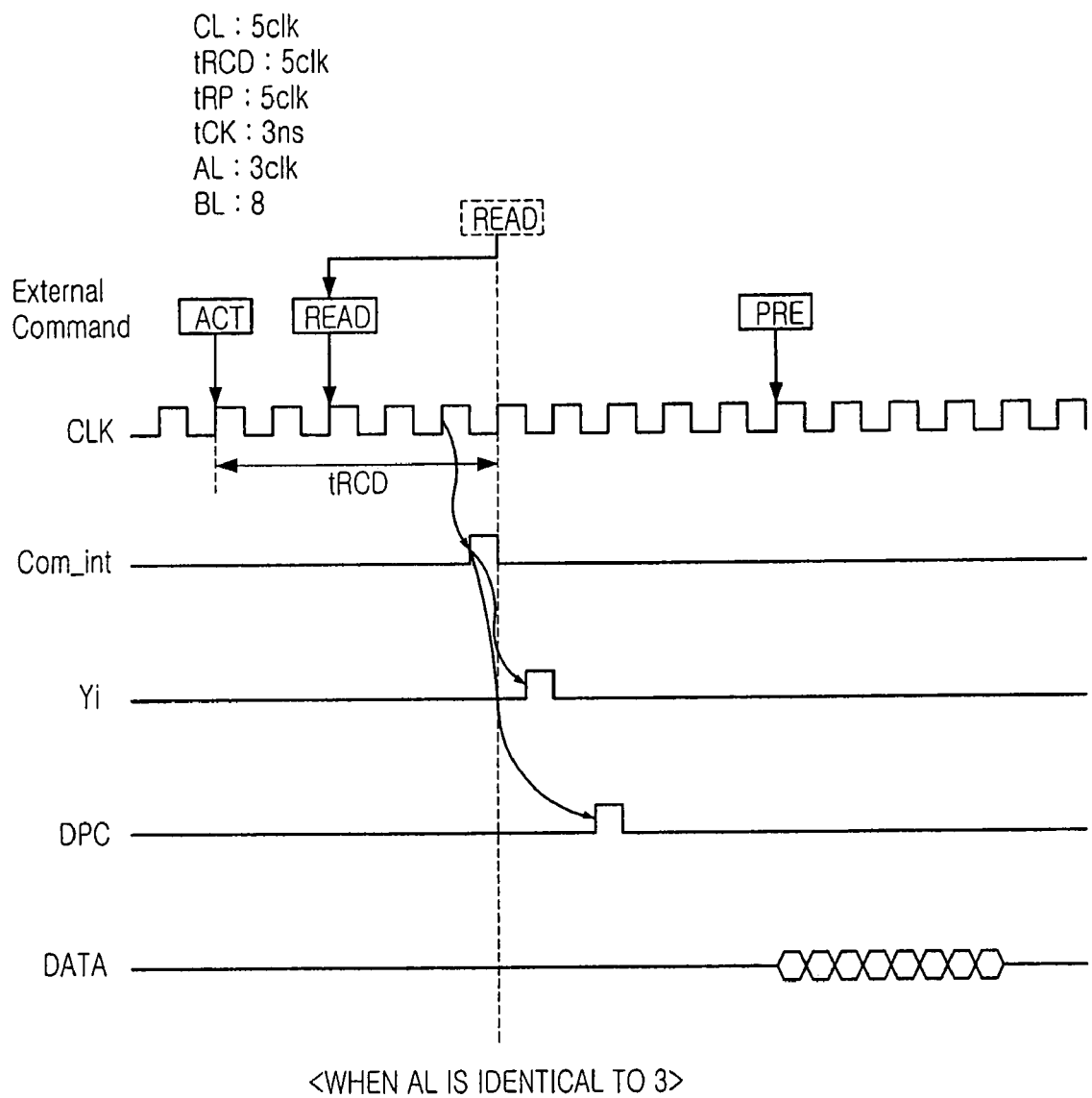
FIG. 10 is a waveform demonstrating a read operation of the semiconductor memory device shown in FIG. 7 when an additive latency is 3.
Figure 11:
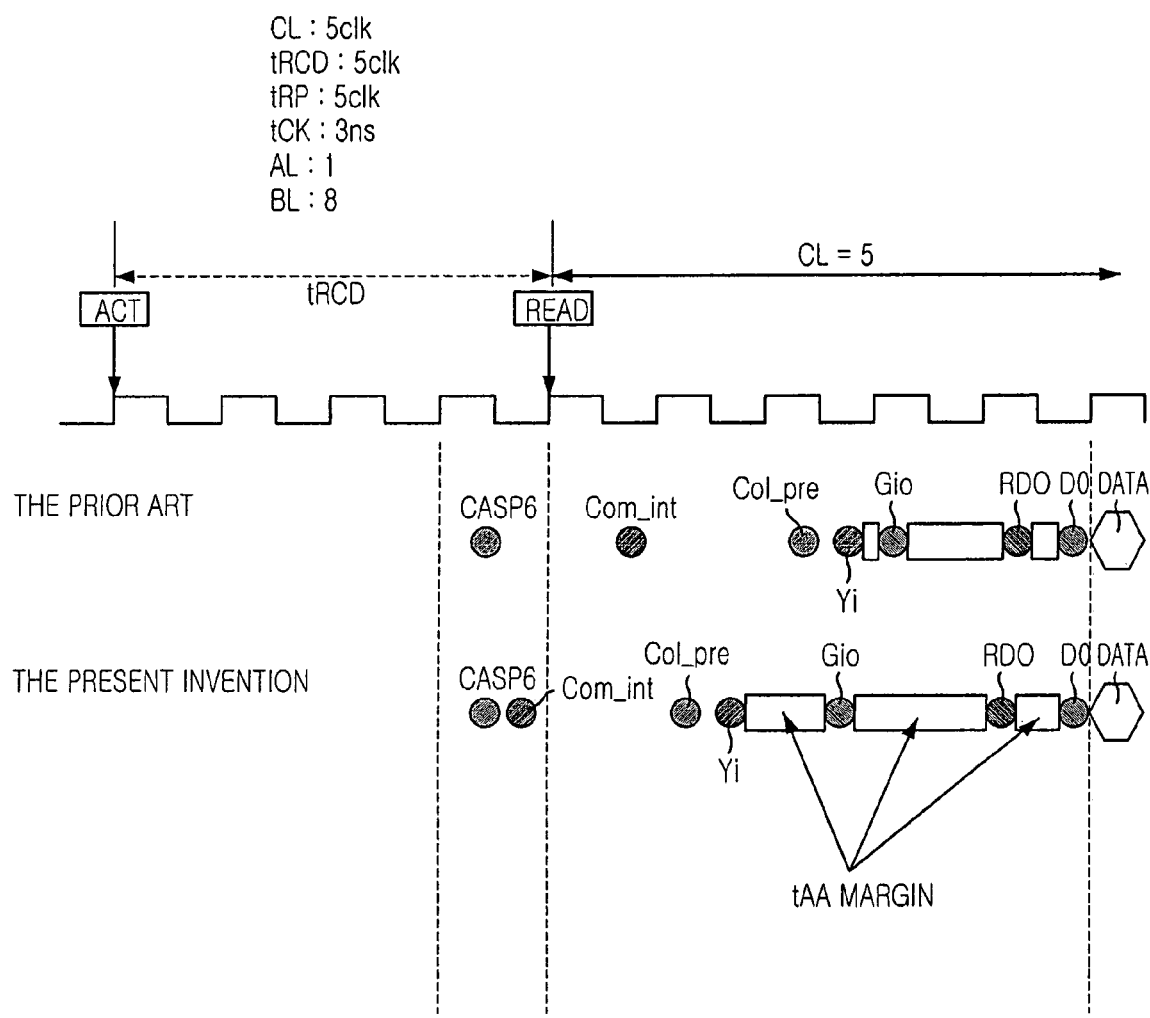
FIG. 11 is a waveform describing an address access timing of the semiconductor memory device in accordance with the present invention as compared with the conventional semiconductor memory device.

FIGS. 9 to 11 are waveforms demonstrating operations of the semiconductor memory device shown in FIG. 7. Hereinafter, referring to FIGS. 7 to 11, the operations of the semiconductor memory device is described in detail.

In the semiconductor memory device in accordance with the present invention, the column active latch 100 outputs the first or second internal command signal Com_int(1) or Com_int(2) at each different timing. Namely, when the additive latency AL is 0, the first internal command signal Com_int(1) is outputted at the tRCD timing; and, otherwise, when the additive latency AL is not 0, the second internal command signal Com_int(2) is outputted at a predetermined timing earlier than the tRCD timing.

Herein, the predetermined timing is earlier one external clock period than the tRCD timing. However, the predetermined timing can be changed based on the additive latency AL. For example, if the additive latency AL is 2, the predetermined timing is earlier two external clock periods than the tRCD timing.

FIG. 9 is a waveform demonstrating a read operation of the semiconductor memory device shown in FIG. 7 when an additive latency is 1.

As shown, when the additive latency AL is 1, the second internal command signal Com_int(2) in response to the read command READ, which is inputted at the timing being earlier one external clock period than the tRCD timing, is directly generated, not past the tRCD timing. Namely, the second internal command signal Com_int(2) can be generated at about earlier one external clock period than the tRCD timing.

As not shown, in response to the second internal command signal Com_int(2), the column address controller 200 outputs the second internal column address Col_int(2) to the column pre-decoder 300. As a result, the column pre-decoder 300 can predecode the second internal column address Col_int(2) in response to the second internal command signal Com_int(2) and output the second pre-decoding signal Col_Pre(2) at a predetermined timing earlier than that of the conventional semiconductor memory device.

Then, the column decoder 43 decodes the second predecoding signal Col_Pre(2) to output as the YI signal. As a result, the sense amplifier block in the bank outputs a requested data among the plurality of amplified data by the YI signal. The requested data DATA is outputted in response to the YI signal and a data path control signal DPC. Herein, the data path control signal DPC means a plurality of control signals for controlling the prefetch block 70 and the data output buffer 80 in response to the second internal command signal Com_int(2).

Consequently, the semiconductor memory device in accordance with the present invention can achieve operations related to the column address at a predetermined timing earlier than that of the conventional semiconductor memory device. Namely, the address access timing tAA is reduced by one external clock period.

FIG. 10 is a waveform demonstrating a read operation of the semiconductor memory device shown in FIG. 7 when an additive latency is 3.

As shown, the read command READ is inputted at the timing being earlier three external clock periods than the tRCD timing. Herein, the semiconductor memory device latches the read command READ during two external clock periods and, then, generates the second internal command signal Com_int(2) at the timing being earlier one external clock period than the tRCD timing. Besides this operation, other operations are the same to that shown in FIG. 9. Likewise, the address access timing tAA is reduced by one external clock period.

FIG. 11 is a waveform describing an address access timing of the semiconductor memory device in accordance with the present invention as compared with the conventional semiconductor memory device. Herein, the CAS latency is 5.

As shown, an internal command signal Com_int in the semiconductor memory device in accordance with the present invention is generated earlier about one external clock period than that in the conventional semiconductor memory device. As a result, the pre-decoding signal Col_Pre and the YI signal are also earlier generated.

Therefore, as compared with the conventional semiconductor memory device, even though the timing when the requested data DATA is outputted from the semiconductor memory device in accordance with the present invention-is not earlier, internal blocks related to an address decoding process in the semiconductor memory device in accordance with the present invention have a longer timing margin than those of the convention memory device have. Herein, Gio is a period when the requested data is supplied to the global bit line; and RD0 and D0 is a period when the requested data is latched in the I/O block having the prefetch block 70, the data output buffer 80 and the like.

Therefore, against the prior art that the address access timing tAA is 15 nsec, the address access timing tAA is 12 nsec in the semiconductor memory device in accordance with the present invention.

Figure 12:
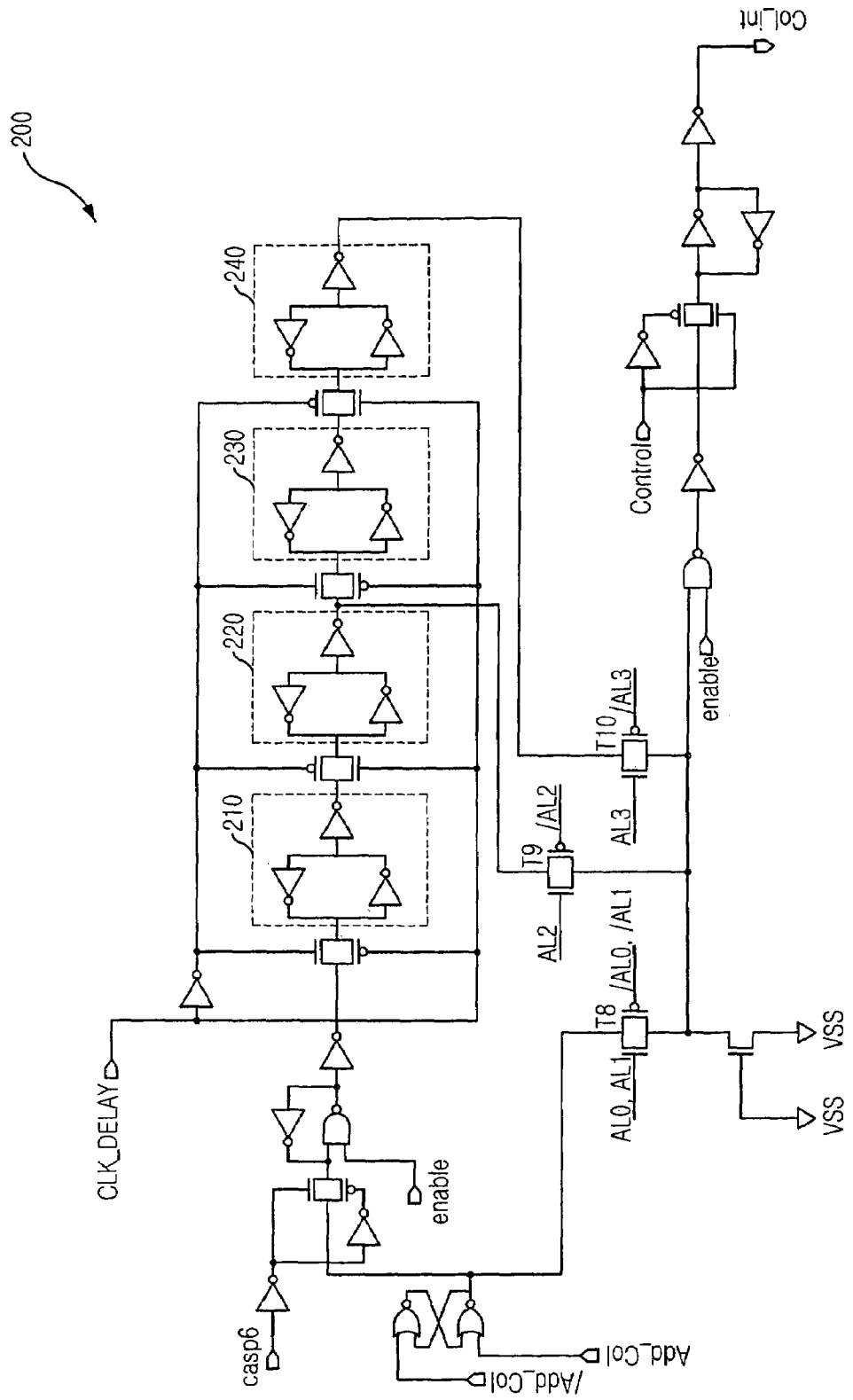
FIG. 12 is a schematic circuit diagram depicting a column address controller shown in FIG. 7.

FIG. 12 is a schematic circuit diagram depicting the column address controller 200 shown in FIG. 7.

As shown, the column address controller 200 includes a first transmission gate T8 for outputting an inputted address signal Add_Col as the internal column address Col_int when the additive latency AL is 0 or 1, i.e. AL0 or AL1; a first to fourth latches 210 to 240 connected serially for sequentially latching the column address Add_Col and /Add_Col synchronized with the external clock; a second transmission gate T9 for outputting the output signal of the second latch 220 as the internal column address Col_int when the additive latency AL is 2, i.e. AL2; and a third transmission gate T10 for outputting the output signal of the fourth latch 240 as the internal column address Col_int when the additive latency AL is 3, i.e. AL3.

If the additive latency AL is 0 or 1, the first transmission gate T8 is turned on. As a result, the column address Add_Col can be outputted without any delay due to the clock signal CLK_DELAY.

Herein, each transmission gate T9 and T10 is coupled at every two latches. As a result, by selectively turning on each transmission T9 to T10 based on the additive latency AL2 and AL3, the timing when the column address controller 200 outputs the internal column address Col_int can be determined. For example, if the additive latency AL is 2, the column address Add_Col is latched for one period of the clock signal CLK_DELAY. Otherwise, if the additive latency AL is 3, the column address Add_Col is latched for two periods of the clock signal CLK_DELAY.

FIG. 13 is a schematic circuit diagram depicting the column active latch 100 shown in FIG. 7.

As shown, the column active latch 100 includes an internal instruction decoder 150 for outputting an decoded signal rd after decoding a plurality of delayed clock signals and inputted command signals; a fourth transmission gate T12 for outputting the decoded signal rd outputted from the internal instruction decoder 150 as the internal command signal Com_int when an additive latency AL is 0 or 1; fifth to eighth latches 110 to 140 connected serially for sequentially latching the decoded signal rd synchronized with the clock signal CLK_DELAY; a fifth transmission gate T13 for outputting the output signal of the second latch 120 as the internal command signal Com_int when the additive latency AL is 2; and a sixth transmission gate T14 for outputting the output signal of the fourth latch 140 as the internal command signal Com_int when the additive latency AL is 3.

Herein, the decoded signal rd in response to commands such as a read command or a write command, e.g. CAS_DELAY, WE_DELAY, RAS_DELAY and CS_DELAY, synchronized with the clock signal CLK_DELAY is sequentially inputted to each of the fifth to eighth latches 110 to 140.

If the additive latency AL is 0 or 1, the fourth transmission gate T12 is turned on. As a result, the decoded signal rd can be outputted without any delay due to the clock signal CLK_DELAY.

Herein, each transmission gate T13 and T14 is coupled at every two latches. As a result, by selectively turning on each transmission T13 to T14 based on the additive latency AL2 and AL3, the timing when the column active latch 100 outputs the internal command signal Com_int can be determined. For example, if the additive latency AL is 2, the decoded signal rd is latched for one period of the clock signal CLK_DELAY. Otherwise, if the additive latency AL is 3, the decoded signal rd is latched for two periods of the clock signal CLK_DELAY.

As mentioned above, by using the column active latch 100 and the column address controller 200 shown in FIGS. 12 and 13, the internal column address Col_int can be outputted at the timing being earlier one external clock than the tRCD timing.

The synchronous semiconductor memory device having the additive latency in accordance with the present invention can reduce the address access time tAA and, as a result, increase the operation speed of the synchronous semiconductor memory device.

Especially, because a structure of the synchronous semiconductor memory device in accordance with the present invention is closely similar to that of the conventional semiconductor memory device, the synchronous semiconductor memory device can be produced without redesigning all of functional block except for a few functional blocks related to a column address.

Against the address access timing tAA is 15 nsec in the conventional semiconductor memory device; the address access timing tAA is 12 nsec in the synchronous semiconductor memory device in accordance with the present invention.

Furthermore, as the synchronous semiconductor memory device has more time for preventing a timing error and improving an address access timing tAA, the semiconductor memory device can be operated more stably. As a result, a fractional yield of the semiconductor memory device is increased.

While the present invention has been described with respect to the particular embodiments, it will be apparent to those skilled in the art that various changes and modification may be made without departing from the spirit and scope of the invention as defined in the following claims.

What is claimed is:

1. An apparatus for controlling operations of a synchronous semiconductor memory device, wherein each operation is achieved by a plurality of internal instructions, comprising:
   a reference clock block for receiving an external clock and outputting a plurality of delayed clock signals; and
   a control block, in response to the plurality of delayed clock signal, for outputting one of the plurality of internal instructions at a first predetermined timing which is earlier than the timing of starting the operation according to an additive latency.

2. The apparatus as recited in claim 1, wherein the additive latency of the synchronous semiconductor memory device is not 0.

3. The apparatus as recited in claim 1, wherein the first predetermined timing is earlier than the tRCD timing by one external clock period.

4. The apparatus as recited in claim 1, wherein the plurality of delayed clock signals includes a clock delay signal, a CAS signal, a chip selecting signal, a write enable signal and a RAS signal.

5. The apparatus as recited in claim 1, wherein the outputted signal from the control block is for controlling whether an inputted column address signal is decoded or not.

6. The apparatus as recited in claim 1, further comprising:
an address controller, in response to one of the plurality of delayed clock signal, for outputting an inputted address signal at a second predetermined timing which is earlier than the timing of starting the operation; and
a decoding block for decoding the outputted address signal from the address controller in response to the outputted signal from the control block.

7. The apparatus as recited in claim 6, wherein the control block includes:
a instruction decoder for outputting an decoded signal after decoding the plurality of delayed clock signal;
a first transmission gate for outputting the decoded signal as the outputted signal when an additive latency is 0 or 1;
first to fourth latches connected serially for sequentially latching the decoded signal;
a second transmission gate for outputting the output signal of the second latch as the outputted signal when the additive latency is 2; and
a third transmission gate for outputting the output signal of the fourth latch as the outputted signal when the additive latency is 3.

8. The apparatus as recited in claim 7, wherein the address controller includes:
a first transmission gate for outputting the inputted address signal as the internal column address signal when the additive latency is 0 or 1;
a first to fourth latches connected serially for sequentially latching the column address;
a second transmission gate for outputting the output signal of the second latch as the internal column address when the additive latency is 2; and
a third transmission gate for outputting the output signal of the fourth latch as the internal column address when the additive latency is 3.

9. A synchronous semiconductor memory device, comprising:
an instruction and address receiving block for receiving an external clock, an external instruction, a row address and a column address and outputting a plurality of internal instructions after decoding the external instruction;
a row address control block, controlled by at least one of the plurality of internal instructions, for decoding the row address;
a column address control block, controlled by at least one of the plurality of internal instructions, for decoding the column address;
a bank for inputting or outputting a data in response to the decoded row and column addresses; and
an I/O block for delivering the data between the bank and an external circuit,
wherein the column address control block includes
a reference clock block for receiving an external clock and outputting a plurality of delayed clock signals; and
a control block, in response to the plurality of delayed clock signal, for performing one among the plurality of internal instructions at a first predetermined timing which is earlier than the timing of starting the operation according to an additive latency.

10. The apparatus as recited in claim 9, wherein the additive latency of the synchronous semiconductor memory device is not 0.

11. The apparatus as recited in claim 9, wherein the first predetermined timing is earlier one external clock period than the tRCD timing by one external clock period.

12. The apparatus as recited in claim 9, wherein the plurality of delayed clock signals includes a clock delay signal, a CAS signal, a chip selecting signal, a write enable signal and a RAS signal.

13. The apparatus as recited in claim 9, wherein the outputted signal from the control block is for controlling whether an inputted column address signal is decoded or not.

14. The apparatus as recited in claim 9, further comprising:
an address controller, in response to one of the plurality of delayed clock signal, for outputting an inputted address signal at a second predetermined timing which is earlier than the timing of starting the operation; and
a decoding block for decoding the outputted address signal from the address controller in response to the outputted signal from the control block.

15. The apparatus as recited in claim 14, wherein the control block includes:
a instruction decoder for outputting an decoded signal after decoding the plurality of delayed clock signal;
a first transmission gate for outputting the decoded signal as the outputted signal when an additive latency is 0 or 1;
first to fourth latches connected serially for sequentially latching the column address;
a second transmission gate for outputting the output signal of the second latch as the outputted signal when the additive latency is 2; and
a third transmission gate for outputting the output signal of the fourth latch as the outputted signal when the additive latency is 3.

16. The apparatus as recited in claim 15, wherein the address controller includes:
a first transmission gate for outputting the inputted address signal as the internal column address signal when the additive latency is 0 or 1;
first to fourth latches connected serially for sequentially latching the column address;
a second transmission gate for outputting the output signal of the second latch as the internal column address when the additive latency is 2; and
a third transmission gate for outputting the output signal of the fourth latch as the internal column address when the additive latency is 3.

17. A method for controlling operations of a synchronous semiconductor memory device, wherein each operation is achieved by a plurality of internal instructions performing an instruction in response to an additive latency, comprising the step of:

A) receiving an external clock and outputting a plurality of delayed clock signals; and B) outputting one of the plurality of internal instructions at a first predetermined timing which is earlier than the timing of starting the operation, in response to the plurality of delayed clock signal according to the additive latency.

18. The apparatus as recited in claim 17, wherein the additive latency of the synchronous semiconductor memory device is not 0.

19. The apparatus as recited in claim 17, wherein the first predetermined timing is earlier than the tRCD timing by one external clock period.

20. The apparatus as recited in claim 17, wherein the plurality of delayed clock signals includes a clock delay signal, a CAS signal, a chip selecting signal, a write enable signal and a RAS signal.

* * * * *

UNITED STATES PATENT AND TRADEMARK OFFICE
CERTIFICATE OF CORRECTION

PATENT NO. : 7,278,044 B2
APPLICATION NO. : 10/788550
DATED : October 2, 2007
INVENTOR(S) : Ho-Uk Song Page 1 of 1

It is certified that error appears in the above-identified patent and that said Letters Patent is hereby corrected as shown below:

In Column 14, Claim 11, line 13, please delete "one external clock period"

Signed and Sealed this

Thirtieth Day of June, 2009

JOHN DOLL
*Acting Director of the United States Patent and Trademark Office*